United States Patent
Klein

[19]

[11] Patent Number: 6,029,940
[45] Date of Patent: Feb. 29, 2000

[54] SUPPORT PLATE

[75] Inventor: Traugott Klein, Herrenberg, Germany

[73] Assignee: Hewlett-Packard Company, Palo Alto, Calif.

[21] Appl. No.: 08/965,166

[22] Filed: Nov. 6, 1997

[30] Foreign Application Priority Data

Aug. 9, 1997 [DE] Germany ................ 297 14 294 U

[51] Int. Cl.[7] .................................................. F16B 17/00
[52] U.S. Cl. .............................. 248/346.04; 248/222.12; 248/500; 248/673; 248/681
[58] Field of Search .................... 248/673, 681, 248/221.11, 222.11, 682, 346.04, 500, 503.1, 222.12; 292/163, 168

[56] References Cited

U.S. PATENT DOCUMENTS

| | | | |
|---|---|---|---|
| 117,874 | 8/1871 | Fellows | 248/503.1 |
| 1,052,150 | 2/1913 | Kindl | 248/503.1 |
| 1,063,716 | 6/1913 | McLaughlin | 248/681 |
| 2,060,543 | 11/1936 | White | 248/346.04 |
| 2,865,697 | 12/1958 | Staley | 248/500 X |
| 2,901,303 | 8/1959 | Anderson | 248/222.11 X |
| 3,036,803 | 5/1962 | Fiebelkorn | 248/221.11 |
| 4,113,217 | 9/1978 | O'Connell | 248/222.11 |
| 4,747,570 | 5/1988 | Takahashi | 248/346.04 X |
| 5,398,157 | 3/1995 | Paul | 248/221.11 X |
| 5,611,513 | 3/1997 | Rosen | 248/222.11 |

*Primary Examiner*—Derek J. Berger

[57] ABSTRACT

An apparatus is proposed for supporting a device, the apparatus having at least one foot with an undercut. The apparatus has a depression for accepting the foot and an engaging mechanism with a projection. When the device is moved toward the apparatus, the undercut presses against the projection and thereby displaces the engaging mechanism. As soon as an upper edge of the undercut moves below a lower edge of the projection, the engaging mechanism moves back toward its starting position and thereby engages the undercut of the foot.

2 Claims, 4 Drawing Sheets ns 60 via the undercuts 40.
SUPPORT PLATE

BACKGROUND OF THE INVENTION

Mechanical fixation especially of portable devices is often performed by connecting them to a support plate that can in turn be fixedly attached to a surface or otherwise.

SUMMARY OF THE INVENTION

It is an object of the present invention to provide a support plate that permits simple fixation of a device on the support plate.

An apparatus is proposed for supporting a device having at least one foot with an undercut. In accordance with the invention, the apparatus has a depression for accepting the foot and an engaging mechanism with a projection. When the device is moved toward the apparatus, the undercut presses against the projection, thereby displacing the engaging mechanism. As soon as an upper edge of the undercut moves below a lower edge of the projection, the engaging mechanism moves back toward its starting position and thereby engages the undercut of the foot.

The invention permits simple and rapid attachment of the device and can for example also be performed with one arm without additional aids. A corresponding release mechanism permits rapid removal and release of the device by simply pressing a release button.

BRIEF DESCRIPTION OF THE DRAWINGS

The invention will be further described in the following with reference to the drawings, in which.

DETAILED DESCRIPTION OF THE DRAWINGS

Figure 1:
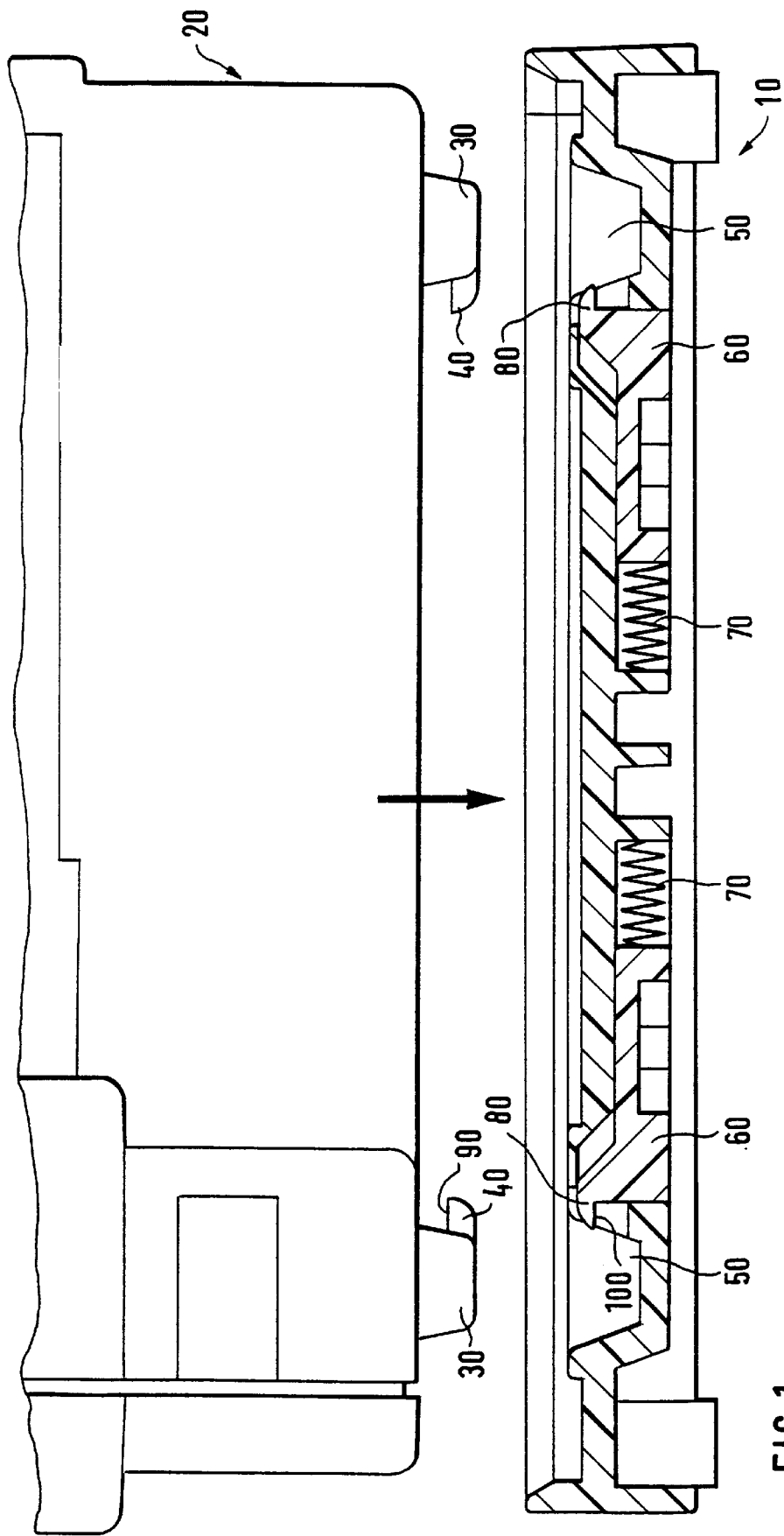
FIG. 1 shows a support plate 10 of the invention.

FIG. 1 shows a support plate 10 in accordance with the invention. A device 20, which is to be brought into contact with the support plate 10 (as indicated by the arrow), has feet 30 provided with an undercut 40. The support plate 10 has corresponding depressions 50 for accepting the feet 30. Furthermore, the support plate 10 has engaging mechanisms 60 that are preferably supported by a spring 70 perpendicular to the direction of motion of the device. The engaging mechanisms 60 moreover have a projection 80.

When the device 20 is moved toward the support plate 10 (in the direction of the arrow), the undercuts 40 press against the corresponding projections 80 and thereby displace the engaging mechanisms 60 toward the springs 70, such that the latter are compressed. As soon as an upper edge 90 of the undercut 40 moves below a lower edge 100 of the projection 80, the engaging mechanism 60 retracts—driven by the spring 70—and thereby engages the undercut 40 of the foot 30 such that the latter can no longer be displaced in the direction opposite the arrow shown in FIG. 1.

It should be noted that the engagement of feet 30 via the engaging mechanisms 60 preferably occurs by simultaneous insertion of all feet 30 into the depressions 50 of the support plate. Simultaneous insertion is normally promoted by the weight of device 20 itself.

Figure 2:
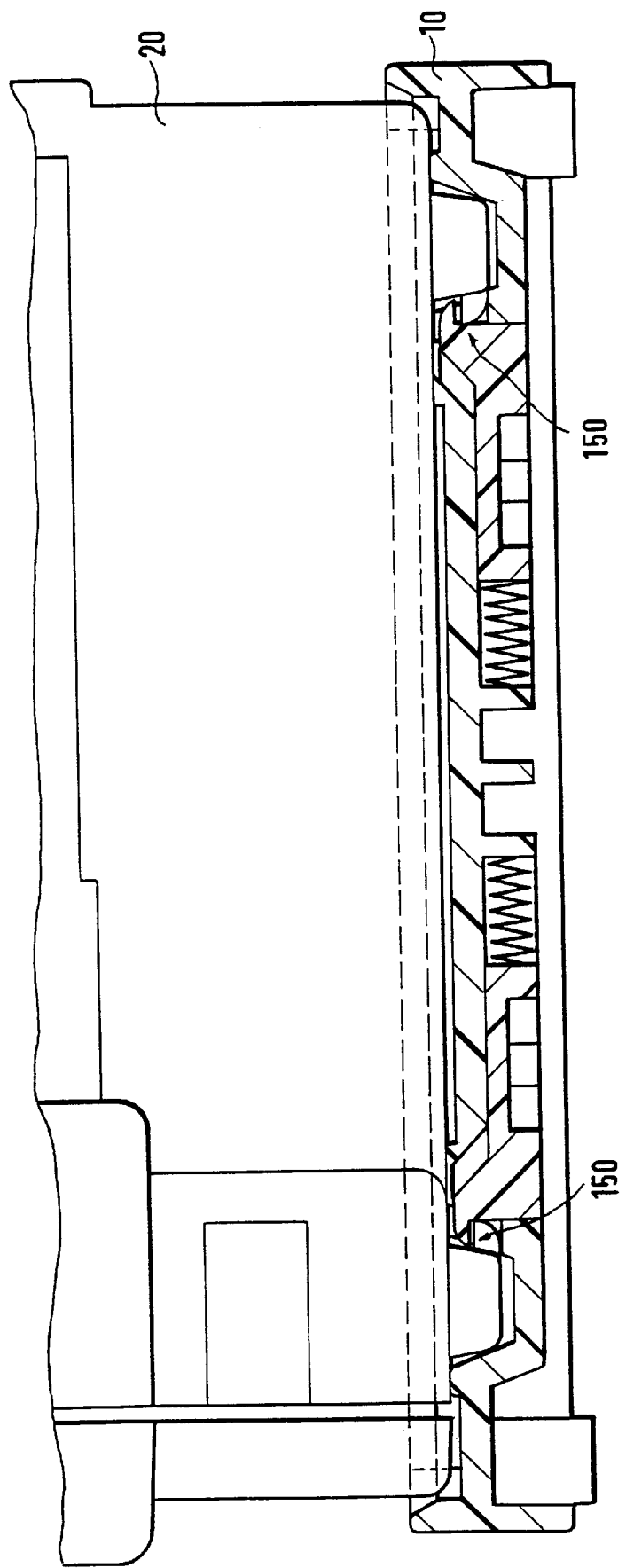
FIG. 2 shows the device 20 engaged with the support plate 10.

FIG. 2 shows device 20 engaged with the support plate 10. At the locations designated by 150, it can be seen how the feet 30 of device 20 are fixed by the engaging mechanisms 60 via the undercuts 40.

In the disengaged state (FIG. 1), the springs 70 are preferably in an uncompressed state not subjected to force, but they can also be partially compressed under a certain amount of force. The latter permits better mechanical fixation and compensates for any tolerance deviations or fatigue symptoms of the springs 70, although it also requires additional effort when the device 20 is inserted.

Engaging mechanisms 60 and feet 30 situated opposite one another, including the corresponding undercuts 40 and projections 80, are preferably arranged in mirror image as depicted in FIGS. 1 and 2, but they can also be arranged in the same direction.

The projections 80 and undercuts 40 are preferably shaped such that in the disengaged state the sides facing one another have a rounded shape as shown in FIG. 1, while in the engaged state (FIG. 2) the sides facing one another lie flat against each other. The rounded sides facilitate insertion of the feet 30 into the depressions 50, while the flat sides provide sufficient fixation of the feet within the depression 50.

Figure 3:
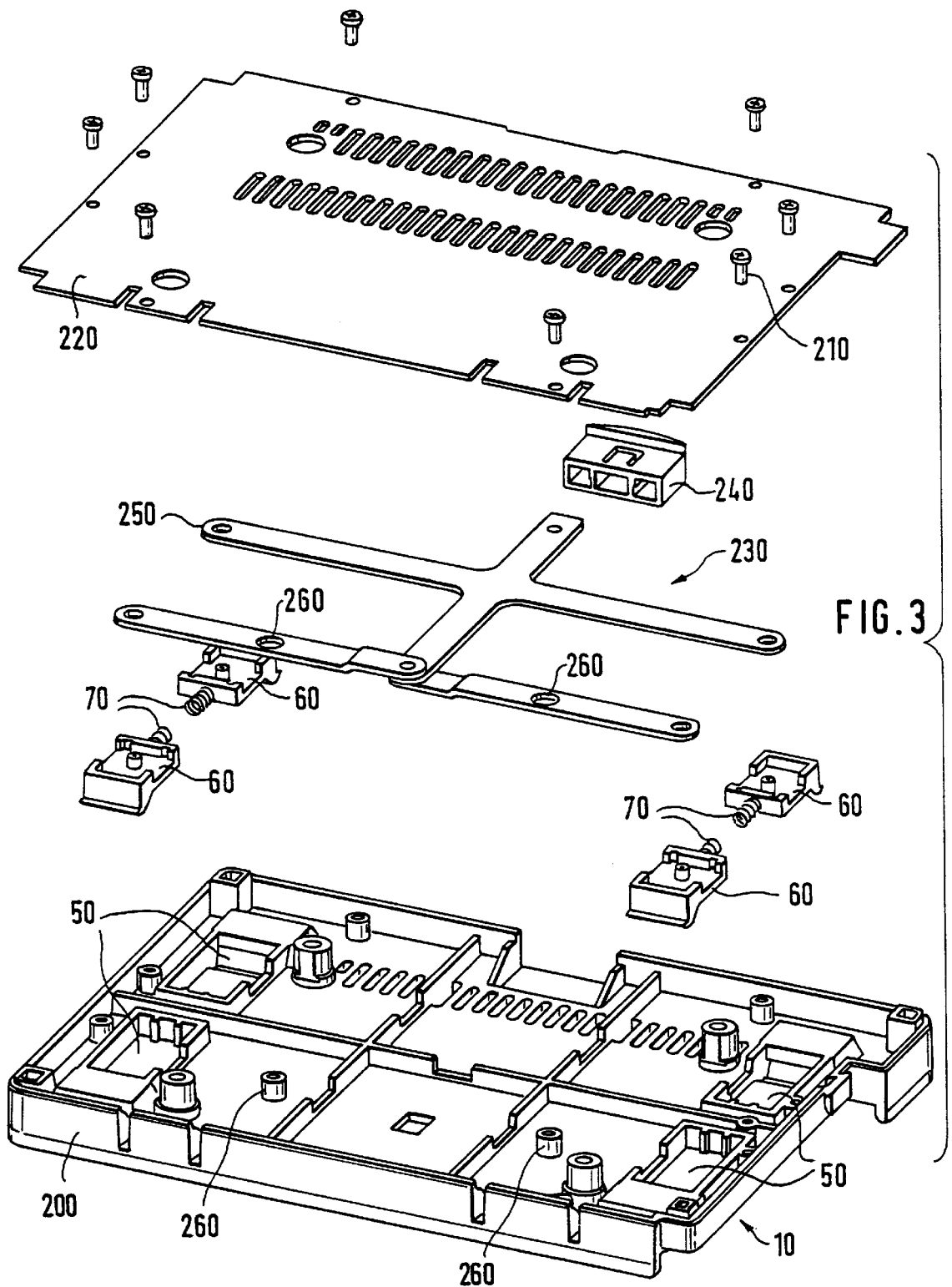
FIG. 3 shows the construction of a preferred embodiment of the support plate 10 of the invention.

FIG. 3 shows the construction of a preferred embodiment of the support plate 10 of the invention. The base structure of support plate 10 comprises a base plate 200, an upper plate 220 secured with a plurality of screws 210 to the base plate 200, four engaging mechanisms 60, each with a spring element 70, and a release mechanism 230 consisting of a release button 240, which is connected to a release linkage mechanism 250. It should be noted that the support plate 10 shown in FIG. 3 has been rotated by 180° with respect to the illustrations in FIGS. 1 and 2.

In the operational state, a device 20 to be connected to support plate 10 (see FIGS. 1 and 2) is inserted with at most four feet 30 to be engaged and having corresponding undercuts 40 into the depressions 50 of the base plate 200, such that the engaging mechanisms 60 are respectively displaced toward the interior of the base structure 200 and, when the crossover point is reached, spring back, thereby engaging the feet 30.

To release feet 30—and thus device 20—the release button 240 is pressed toward the interior of the base structure 200. This causes the release linkage mechanism 250 to be displaced in accordance with the movement of the release button 240. This displacement causes the engaging mechanisms 60 nearest the release button 240, and via mechanical lever action about pivots 260 the engaging mechanisms 60 situated beyond them as well, to be displaced toward the spring elements 70, such that the projections 80 of the engaging mechanisms 60 release the undercuts 40 of feet 30 of device 20, allowing device 20 to be separated from support plate 10.

It should be noted that the release mechanism 230 can also be operated via elements other than those shown in FIG. 3. However, the release mechanism 230 shown in FIG. 3 permits reliable mechanical release with a minimum of moving parts, which are simply designed. At the same time, the release mechanism 230 permits the engaging mechanisms 60 to be arranged symmetrically to the center axes of the base structure 200, as shown in FIG. 3.

The individual elements of support plate 10, in particular the base plate 200, the upper plate 220, the engaging mechanisms 60, and the release mechanism 230, are preferably made of plastic on polyamide basis. In particular, the plastic GRIVORY GV-6H, which exhibits strength comparable to aluminum, has proven suitable.

Figure 4:
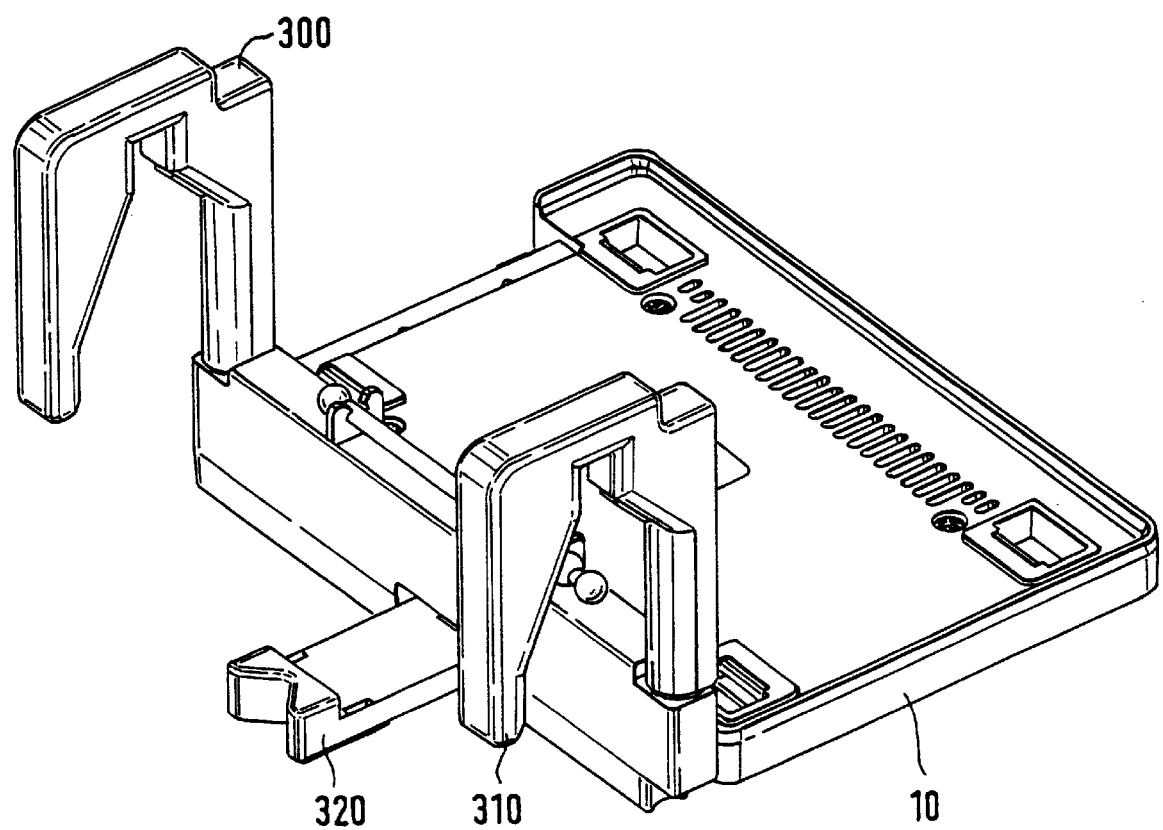
FIG. 4 shows the support plate 10 with two support hooks 300 and 310 for supporting the device on a vertical apparatus.

The support plate 10 can for example be mounted to a surface by suitable attachment means, or it can also be attached to a vertical apparatus using appropriate support devices such as hooks. In the first case, the support plate 10 can be mounted on surfaces at nearly any angle, since the support plate 10, when suitably dimensioned, ensures adequate stability in the engaged state. In the second case, the support plate 10 can be connected to a support hook in accordance with applicant's German utility model application with the same filing date (applicant's internal reference: 20-97-027) and is thereby especially suited for medical applications, such as in hospitals or ambulances, for supporting medical and similar devices in particular. FIG. 4 shows the support plate 10 with two support hooks 300 and 310 for support on a vertical apparatus.

In the case of the vertical attachment of support plate 10, such as by using two hooks as shown in FIG. 4, the support plate 10 preferably has a detent support 320 mounted on the side accommodating the hooks and in contact with the supporting surface. The detent support 320 can preferably be drawn away from the support plate 10 and engaged in a number of positions, thus permitting, as required, an inclined suspended position of support plate 10, and thereby of device 20.

Due to the design of the engaging mechanisms 60 and the feet 30 with the appropriate undercuts 40, device 20 can be mounted in any desired position of the support plate, whether upright, suspended, or inclined, and in most cases attached and engaged without additional effort, solely on the basis of the weight of device 20 itself. This permits in particular simple and rapid attachment of device 20 without additional aids and can for example be conducted with one arm without additional aids. In the same manner, the release mechanism 230 allows rapid removal and release of device 20 by simply pressing release button 240.

I claim:

1. Apparatus comprising:

a device with plural feet, each foot having an undercut;

a base plate having plural depressions therein for accepting the feet, each depression including a spring controlled engaging mechanism with a projection, at least a pair of said spring controlled engaging mechanisms in said plural depressions operable in opposition to each other, an upper plate attachable to the base plate by a plurality of fastening means, and a release mechanism positioned between said upper plate and base plate, incorporating a release control and coupled to each of said pair of engaging mechanisms, operable to concurrently release each of said pair of engaging mechanisms upon operation of said release control;

whereby when the device is moved into engagement with the base plate the undercuts press against the projections of said pair of engaging mechanisms and thereby displace the engaging mechanisms in opposed directions and when upper edges of the undercuts move below lower edges of the projections, the pair of engaging mechanisms move in opposite directions back toward starting positions thereof and thereby engage the undercuts of the feet.

2. Apparatus in accordance with claim 1, further comprising: a detent support coupled to said base plate, movable with respect thereto and engageable in a plurality of positions to abut an adjacent support surface and allow an inclined position of said apparatus.

* * * * *